(12) United States Patent
Mischitz et al.

(10) Patent No.: US 9,177,790 B2
(45) Date of Patent: Nov. 3, 2015

(54) INKJET PRINTING IN A PERIPHERAL REGION OF A SUBSTRATE

(71) Applicant: Infineon Technologies Austria AG, Villach (AT)

(72) Inventors: Martin Mischitz, Wernberg (AT); Karl Heinz Gasser, Spittal/Drau (AT); John Cooper, Villach (AT); Kae-Horng Wang, Villach (AT)

(73) Assignee: Infineon Technologies Austria AG, Villach (AT)

( * ) Notice: Subject to any disclaimer, the term of this patent is extended or adjusted under 35 U.S.C. 154(b) by 24 days.

(21) Appl. No.: 14/067,661

(22) Filed: Oct. 30, 2013

(65) Prior Publication Data

US 2015/0115415 A1    Apr. 30, 2015

(51) Int. Cl.
*H01L 23/58* (2006.01)
*H01L 21/02* (2006.01)
*H01L 23/29* (2006.01)
*H01L 21/56* (2006.01)
*H01L 21/67* (2006.01)

(52) U.S. Cl.
CPC .... *H01L 21/02288* (2013.01); *H01L 21/02118* (2013.01); *H01L 21/56* (2013.01); *H01L 21/67* (2013.01); *H01L 23/293* (2013.01)

(58) Field of Classification Search
CPC .............................. H01L 21/3105; B29C 59/16

USPC ........... 438/778; 257/E21.241, 632; 267/447; 425/174.4

See application file for complete search history.

(56) References Cited

U.S. PATENT DOCUMENTS

| | | | |
|---|---|---|---|
| 5,482,660 A * | 1/1996 | Yamamoto et al. ........... 264/474 |
| 8,011,916 B2 * | 9/2011 | Suehira et al. ................ 425/385 |
| 8,764,431 B2 * | 7/2014 | Yamashita et al. ............ 425/385 |
| 2003/0003179 A1* | 1/2003 | Farnworth et al. ......... 425/174.4 |
| 2003/0067512 A1* | 4/2003 | Tominaga et al. .............. 347/69 |
| 2004/0142058 A1* | 7/2004 | Farnworth ................. 425/174.4 |
| 2004/0159967 A1* | 8/2004 | Farnworth ...................... 264/71 |
| 2004/0219770 A1* | 11/2004 | Kimino .......................... 438/584 |
| 2005/0151285 A1* | 7/2005 | Grot ........................... 264/1.36 |
| 2007/0138699 A1* | 6/2007 | Wuister et al. ................ 264/319 |
| 2009/0224436 A1* | 9/2009 | Mikami et al. ................ 264/447 |
| 2009/0243125 A1* | 10/2009 | Pugh et al. .................... 264/1.36 |
| 2013/0078820 A1* | 3/2013 | Mikami ........................ 438/778 |
| 2013/0078821 A1* | 3/2013 | Furutono ...................... 438/780 |

OTHER PUBLICATIONS

Boulord, B., et al., "Characterization and optimization of electroless nickel plating for front side silicon solar cells metallization," Institut des Nanotechnologies de Lyon and Institute National de L'Energie Solaire, 2nd Workshop on Metallization, Apr. 14, 2010, Konstanz, 16 pages.

* cited by examiner

*Primary Examiner* — Caleb Henry
(74) *Attorney, Agent, or Firm* — Slater & Matsil, L.L.P.

(57) ABSTRACT

Methods, apparatuses and devices relate to inkjet printing a covering layer on at least a first side of a substrate in a peripheral region thereof are discussed.

21 Claims, 9 Drawing Sheets

INKJET PRINTING IN A PERIPHERAL REGION OF A SUBSTRATE

TECHNICAL FIELD

The present application relates to inkjet printing on peripheral regions of substrates like semiconductor wafers.

BACKGROUND

When manufacturing semiconductor devices on substrates like semiconductor wafers, for example, silicon wafers, metal is deposited on the substrate, for example, on a non-processed backside of the substrate or a processed front side of the substrate or parts thereof, to provide electrical contacts to the semiconductor devices and/or to provide interconnects between various parts of the devices manufactured. Various metal deposition techniques are conventionally used, for example, sputtering, galvanization or electroless plating. One example for electroless plating is electroless nickel plating, where an autocatalytic deposition of nickel phosphorous (NiP) by immersion of the substrate into a plating bath may be used. In some cases, this may lead to the formation of nickel flitter, for example in a peripheral region of the substrate. Similar phenomena may occur using other metals. Such flitter has a poor adherence to the substrate, which constitutes a quality risk as they may detach from the peripheral region of the substrate and, e.g., reach other portions of the substrate, e.g., portions where devices are formed, and which might require additional measures when manufacturing devices, like regular change of filters or of a plating bath used or a separate process step for removing the flitter, which additional measures may increase manufacturing costs. In case of unsuccessful measures, production yield is decreased when due to flitter substrates have to be discarded.

Figure 1:
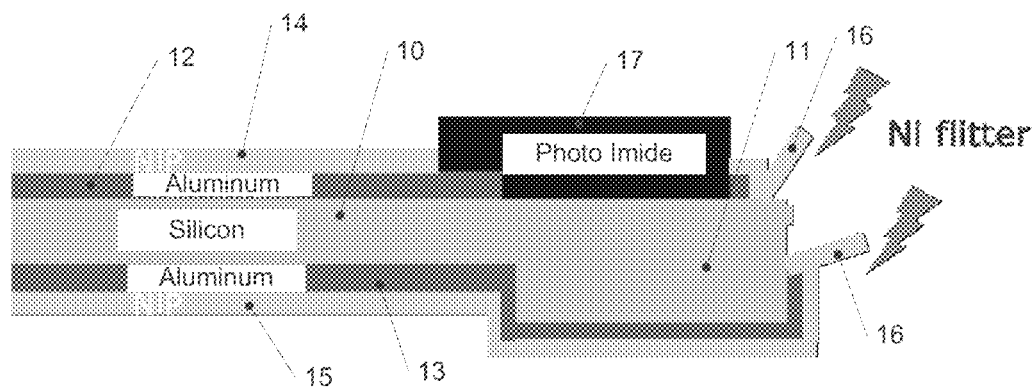
FIG. 1 is a schematic cross-sectional view of a part of a substrate for illustrating flitter formation.

Various embodiments of the present invention will be described in the following with reference to the accompanying figures. It is to be noted that these embodiments have illustration purposes only and are not to be construed as limiting the scope of this application in any way. Features of various embodiments described may be combined with each other unless specifically noted otherwise. On the other hand, describing an embodiment with a plurality of features is not to be construed as indicating that all those features are necessary for practicing the techniques disclosed herein or shown in the drawings, as other embodiments may comprise, for example, less features and/or alternative features.

In various embodiments discussed and described in more detail below, a substrate, for example, a semiconductor wafer, is provided with a covering layer, for example an imide layer, at a peripheral region thereof using inkjet printing techniques. The covering layer may, but need not comprise an isolation material. The covering layer may serve as a passivation layer and/or a protection layer in some embodiments. In some embodiments, the printing is restricted to the peripheral region, i.e., other regions of the substrate are not printed on. In some embodiments, this may occur prior to a metal deposition, for example, comprising electroless plating like the electroless plating of nickel. However, applications of the techniques and apparatuses described in the following are not limited to specific metals or substrates. In some embodiments, by forming the covering layer at the peripheral region of the substrate, formation of flitter like nickel flitter may be prevented, minimized or reduced.

DETAILED DESCRIPTION OF ILLUSTRATIVE EMBODIMENTS

A peripheral region of a substrate generally is to be understood as a region at or near an edge of the substrate. For example, it may include a peripheral portion of a front side (sometimes referred to as top side) or back side (sometimes also referred to as bottom side) of the substrate extending from the edge inwards, for example, less than 5 mm inwards, e.g., between 1 and 2 mm inwards, and/or the edge, i.e., the side surface of the substrate, or part thereof. In many cases, the front side of the substrate is a side where devices like semiconductor devices are formed, whereas the back side is free of such devices, although this is not necessarily the case. The edge, i.e., side surface, may have various shapes, for example, a rounded shape or a beveled shape. In some embodiments, the peripheral region of the substrate may comprise a ring thicker than the remaining substrate or may comprise a part of the ring. A covering layer or insulator in the context of this application generally refers to an electrical isolation unless noted otherwise.

While in the following semiconductor wafers frequently will be used as examples for substrates, it is to be noted that techniques disclosed herein may also be applied to other types of substrates. Semiconductor wafers may be silicon wafers, but may also be wafers made of other kinds of semiconductor materials like gallium arsenide.

Turning now to the figures, in FIG. 1 a cross-sectional view of a substrate, in the example shown a semiconductor wafer, which has been processed is schematically shown to illustrate formation of flitter. In FIG. 1, in particular, a part of the processed substrate including a peripheral region is shown. In the example of FIG. 1, the wafer is a silicon wafer 10 with a thicker ring-shaped portion 11 at a periphery thereof. Such a wafer may, for example, be obtained by thinning a central portion of a back side of the wafer prior to or after forming devices on the front side of the wafer, such processing also being referred to as Taiko processing. The resulting wafer with a thin central portion and a peripheral thicker ring-shaped portion is also referred to as Taiko wafer, the ring-shaped portion being referred to as Taiko ring.

In an example process, on the front side of silicon wafer 10 an aluminum layer 12 is formed, and on the backside of the semiconductor wafer an aluminum layer 13 is formed. After deposition of the aluminum layer, by photolithography an insulator 17, for example, an imide (referred to as photoimide in FIG. 1) is deposited on silicon wafer 10. This insulator 17 is part of a conventional processing of semiconductor wafers and in other types of processing may also be omitted. Then, on aluminum layer 12, subsequently a second metal layer, in this case, for example, a nickel layer deposited by electroless plating using a nickel phosphorous (NiP) bath, is formed, and on the back side likewise a second metal layer, in this case also a nickel layer 15, is formed. Other processes may be used as well. This process, as already described in the introductory portion, may lead to the formation of nickel flitter 16 in a peripheral region of silicon wafer 10 which has a poor adherence and may require extra process steps for removal, may deteriorate device performance and/or may decrease production yield. Therefore, the occurrence of such nickel flitter 16 is undesirable.

Therefore, as mentioned above, in some embodiments a covering layer is deposited at a peripheral region of a substrate by inkjet printing, for example, in regions prone to flitter formation, which in some embodiments may prevent or reduce flitter formation.

Figure 2:
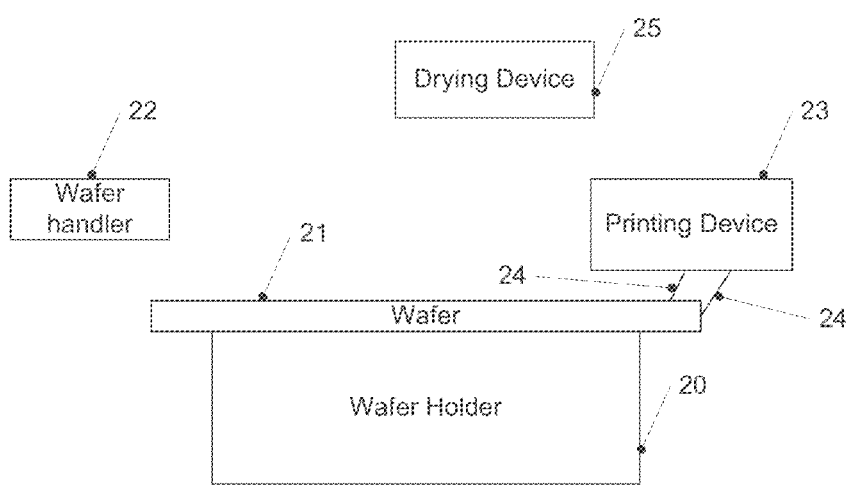
FIG. 2 is a schematic diagram illustrating an apparatus according to an embodiment.

In FIG. 2, an apparatus for applying a covering layer to a peripheral region of a wafer by means of inkjet printing is schematically shown. The apparatus of FIG. 2 may, for example, be implemented as one or more stations of a semiconductor processing line for processing substrates like semiconductor wafers to form devices. In other words, prior to being processed by the apparatus of FIG. 2 and/or after being processed by the apparatus of FIG. 2 substrates like semiconductor devices may be processed by other conventional apparatuses or devices known in the art, for example, in the art of semiconductor processing.

The apparatus of FIG. 2 comprises a wafer holder 20, for example, a chuck, for receiving a semiconductor wafer 21. In other embodiments, generally a substrate holder to receive a substrate may be used. An example for a suitable wafer holder in form of a chuck will be explained later with reference to FIGS. 3-7.

Furthermore, the apparatus of FIG. 2 comprises an inkjet printing device to print a suitable ink on a peripheral region of wafer 21. In some embodiments, inkjet printing device 23 may be stationary approximately as shown in FIG. 2, while wafer holder 20 rotates wafer 21 to thus print on the complete circumference of wafer 21. In other embodiments, printing device 23 additionally or alternatively may be movable with respect to wafer 21 to print on desired areas. An angle under which ink 24 is printed on wafer 21 may be selected such that also a side surface (edge) of wafer 21 is at least partially printed thereon, as shown by ink jet 24 in FIG. 2.

Moreover, the apparatus of FIG. 2 comprises a wafer handler 22, for example, for placing wafer 21 onto wafer holder 20 or for flipping wafer 21 as will be explained further below. Furthermore, as ink for printing device 23, for example, an imide, in particular a polyimide, or an epoxy ink may be used. Further details on possibilities for usable inks in some embodiments will also be given below.

Additionally, in FIG. 2 a drying device 24 is schematically shown which is configured to dry ink printed on wafer 21. Drying device 25 may for example be a kind of furnace into which wafer 21 is placed for drying by wafer handler 22, or may, for example, comprise a radiation heater like an infrared lamp for irradiating parts of wafer 21 onto which ink has been printed. In other embodiments, drying device 25 may, for example, supply warm air to desired parts of wafer 21. In other embodiments, no drying device 25 may be provided, and a drying, if necessary, may just be performed by waiting until the ink printed on wafer 21 has dried in ambient conditions.

In some embodiments, after the ink printed on wafer 21 as schematically shown has been dried, wafer handler 22 flips wafer 21 such that another face of wafer 21 faces printing device 23. For example, if a first printing has been performed onto a front side and edge of wafer 21, after flipping a second printing may be performed on the back side of wafer 21, or vice versa. In some embodiments, in this way in a peripheral region of wafer 21 front side, back side and the edge may be covered with ink. In other embodiments, inkjet printing may be performed only on one side (front side or back side) of wafer 21, possibly also covering at least part of the edge of wafer 21.

Figure 3:
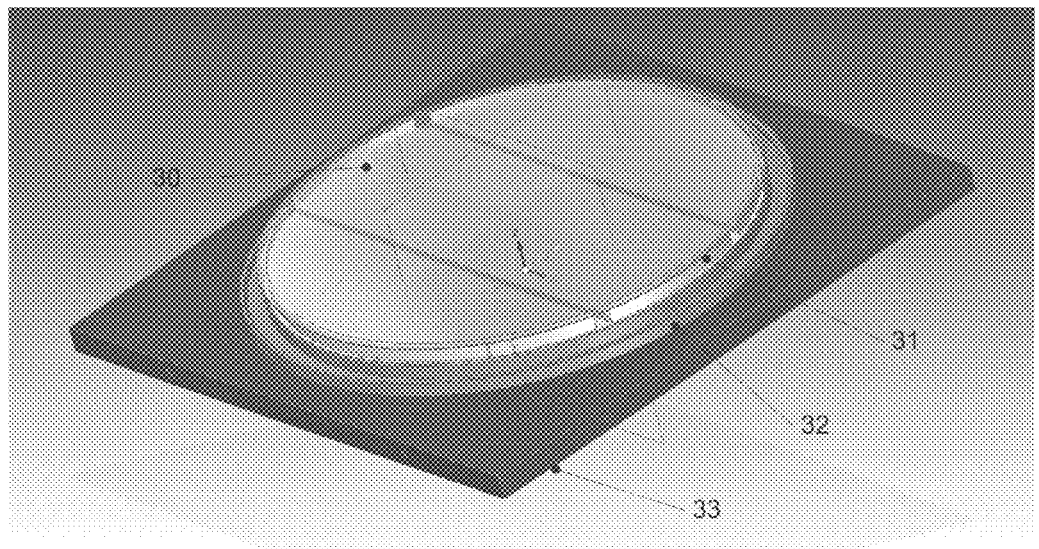
FIG. 3 is a perspective view of a wafer holder usable in some embodiments.
Figure 4:
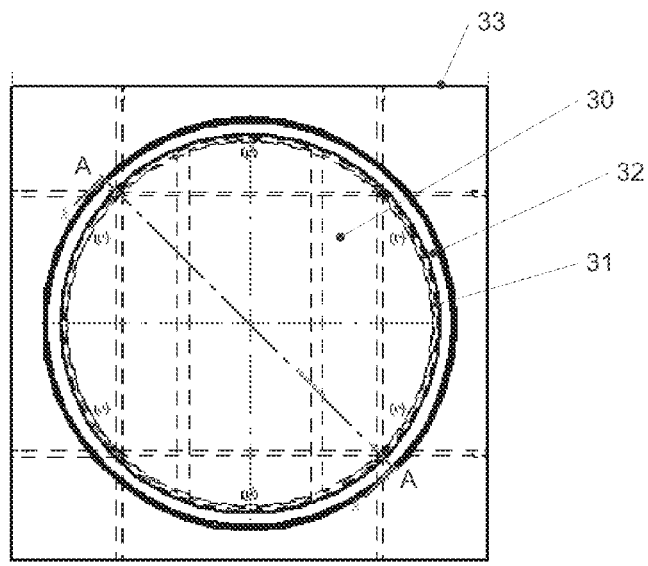
FIG. 4 is a top view of the wafer holder of FIG. 3.
Figure 5:
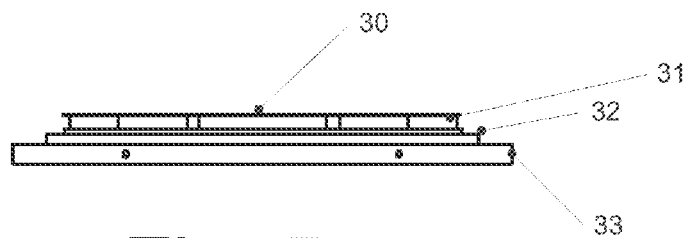
FIG. 5 is a side view of the wafer holder of FIG. 3.
Figure 6:
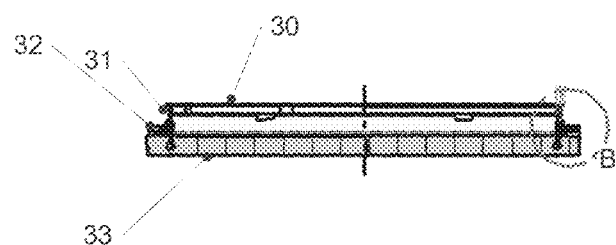
FIG. 6 is a cross-sectional view along a line A-A in FIG. 4.
Figure 7:
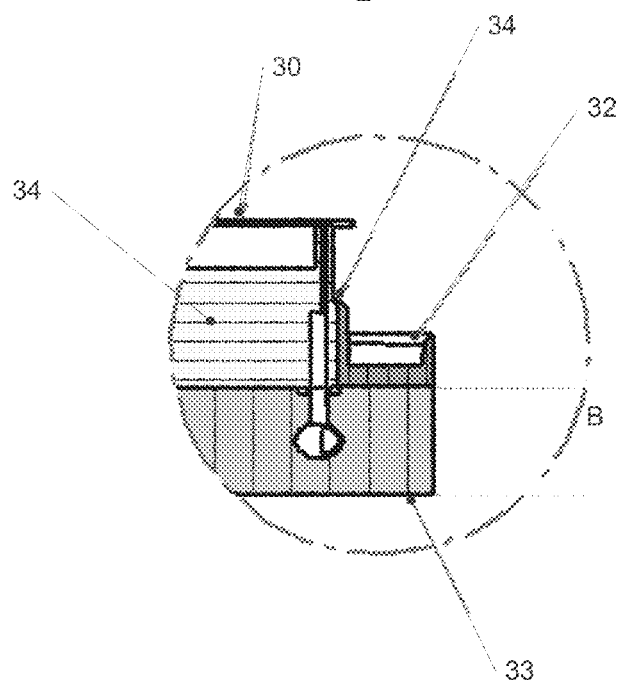
FIG. 7 is an enlarged view of a detail B of FIG. 6.

Next, with reference to FIGS. 3-7, a wafer holder according to an embodiment is schematically shown. FIG. 3 shows a perspective view of the wafer holder, FIG. 4 shows a top view of the wafer holder, FIG. 5 shows a side view of the wafer holder, FIG. 6 shows a cross-sectional view along a line A-A of FIG. 4 of the wafer holder, and FIG. 7 shows a detail B of the cross-sectional view of FIG. 6.

The wafer holder of FIGS. 3-7 comprises a base plate 33 onto which a chuck is mounted. The chuck as can be seen, for example, in FIG. 7 comprises peripheral supports 31 to support a wafer 30 at a periphery thereof and a main body 34. By supporting wafer 30 only at the periphery thereof, both sides of wafer 30 may be printed as mentioned already with respect to FIG. 2, i.e., wafer 30 may be placed onto the wafer holder with both sides, without the chuck touching devices formed on the wafer, but only a peripheral region where no devices are formed and therefore no damage may be caused. Wafer 30 may be held to chuck 34 by a vacuum as also used in conventional chucks.

The peripheral support region 31 of the chuck may, for example, have a width between 1 and 2 mm, although other widths are equally possible.

Furthermore, the wafer holder of FIGS. 3-7 comprises a drip ring 32 surrounding the chuck which serves to collect ink dripping from wafer 30 or parts of the wafer holder shown or ink which is printed besides wafer 30. Therefore, in some embodiment excess ink may be collected. Drip ring 32 may then be exchanged and/or cleaned in regular or irregular intervals to avoid contamination.

It is to be noted that the wafer holder depicted in FIGS. 3-7 is only one possible example for implementing a wafer holder, and other types of wafer holders, for example, wafer holders without drip ring, may be equally used.

Figure 8:
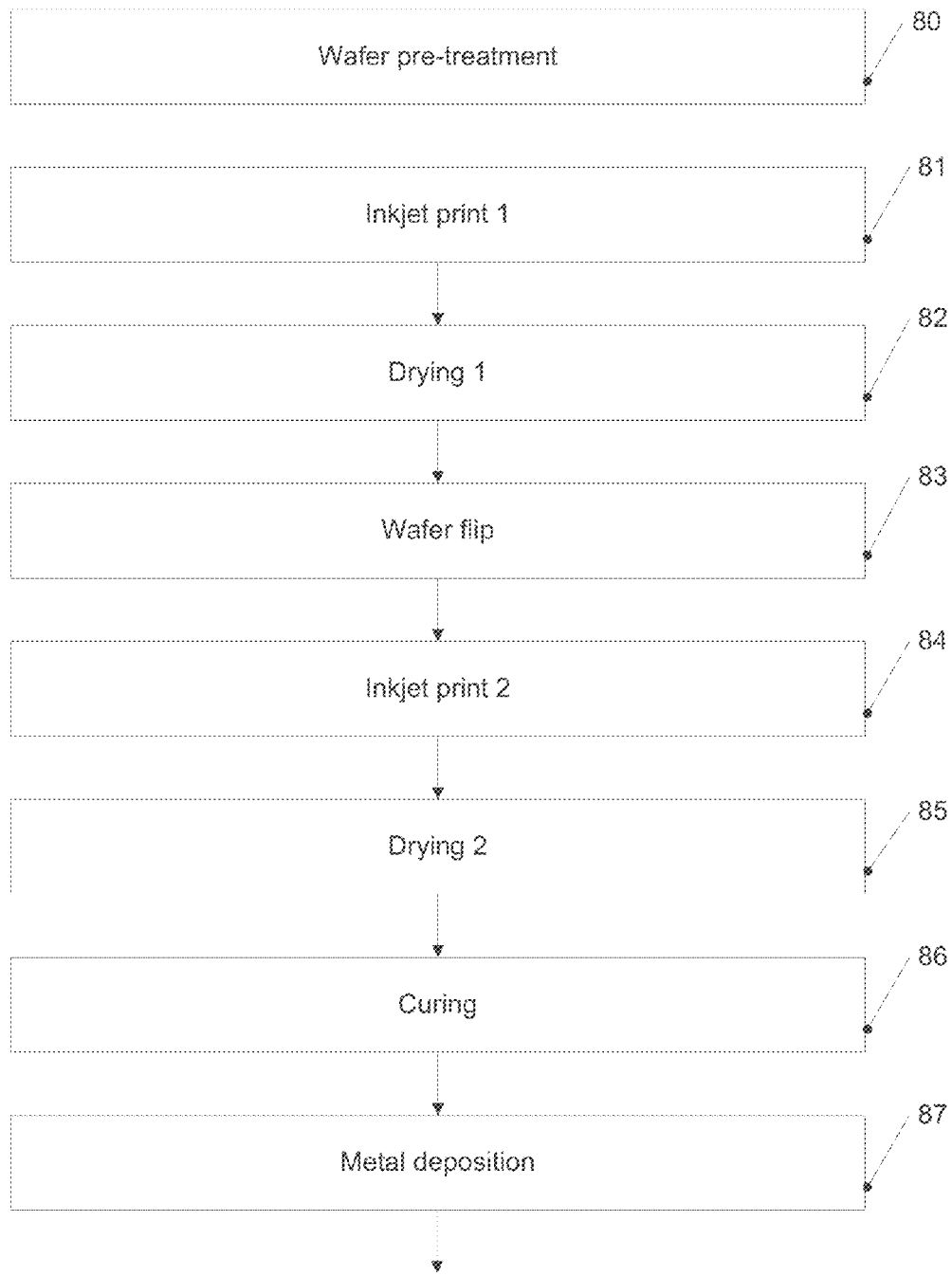
FIG. 8 is a flowchart illustrating a method according to an embodiment.

In FIG. 8, a flowchart illustrating a method according to an embodiment is shown. The method illustrated in FIG. 8 may, for example, be implemented using the apparatus discussed with reference to FIGS. 2-7, but may also be implemented using other techniques or apparatuses.

Moreover, while the method is described as a series of acts or events, the order in which these acts or events are described and depicted in FIG. 8 is not be construed as limiting, as in other embodiments the order may be different, some acts or events may be omitted, additional acts or events may be implemented and/or some acts or events may occur concurrently with each other.

As indicated by an arrow leading to a box 80 of FIG. 8 and an arrow leading away from a box 87 in FIG. 8, the method depicted in FIG. 8 may be part of a larger process flow for processing substrates like semiconductor wafers, for example, silicon wafers. In other words, conventional processing techniques for processing substrates may be employed before, after and/or during the method now described with reference to FIG. 8.

At 80, in preparation for a inkjet printing described later, a wafer pre-treatment is performed, for example, to adjust a surface energy of the wafer surface to be printed thereon for a good wetting with the ink used for the inkjet printing. For example, the pre-treatment may comprise a drying in a furnace at a temperature, for example, between 100 and 200° C., a cleaning with water, isopropanol or other alcohols, for example, alcohols with one to five carbon atoms, a cleaning with dimethyl formamide (DMF) or other solvents, a cleaning with plasma, for example, oxygen plasma, or a treatment with hexamethyl disilizane. For example, in an embodiment a wafer with 8 inch diameter (200 mm), for example, a Taiko wafer with a ring having a thickness of approximately 400 μm and a thickness of the thinned silicon between 20 and 70 μm may be cleaned with water or isopropanol.

Figure 9A:
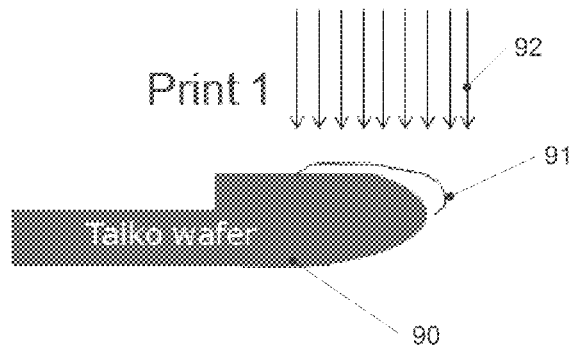
FIGS. 9A and 9B are schematic diagrams illustrating example of processing operations of the embodiment of FIG. 8.

At 81, a first inkjet print is performed. For example, in the first inkjet print a back side of a wafer like a Taiko wafer may be printed. In some embodiments, for this the wafer lies with a front side down on a chuck, wherein for example an inactive area of the Taiko ring may contact, for example, support region 31 of the wafer holder discussed with reference to FIGS. 3-7. An example for such a first print is shown in FIG. 9A, where a peripheral region of a back side of a Taiko wafer 90 is printed with an inkjet technique as indicated by arrows 92. In embodiments, printing is restricted to the peripheral region. This results in a first ink layer 91 covering the back side and part of an edge (side surface) in a peripheral region of Taiko wafer 90. It is to be emphasized that Taiko wafer 90 serves only as an example, and other kinds of wafers or substrates may be used as well, for example, wafers having a regular thickness (i.e., non-thinned wafers) or uniformly thinned wafers. It should be noted that ink ejected besides Taiko wafer 90 (on the right side in FIG. 9A) may be collected by a drip ring like drip ring 32 of FIGS. 3-7.

For example, in an embodiment the print medium, i.e., the ink, may be a thermically network forming polyimide with a viscosity smaller than 25 mPa·s, e.g., between 10 and 20 mPa·s, for example, 15 mPa·s, for example, PIN 6321-001 manufactured by JNC Corporation, although numerous other commercially available and other inks may also be used. For a 200 mm wafer a printing image, i.e., an area to be printed may, for example, be a ring with an inner diameter of 196.0 mm and an outer diameter of 201.0 mm such that both the back side and the edge of the wafer is printed thereon. In an embodiment, the printing resolution may be between 400 and 1200 dpi (dots per inch), for example, between 800 and 1000 dpi. In some embodiments, such a resolution on the one hand causes a high drop density of ink drops which increases a wetting of the edge and on the other hand reduces a risk of not recognizing defects of individual nozzles between nozzle checks at a beginning of a printing. With such resolutions, for example, a trace of lacking ink would be visible. Printing may be performed at a sabre angle of the printing head between 75° and 89°, for example, between 80° and 86°, e.g., about 84.26° for an x direction (directions are shown for example in FIG. 3), the xy-plane being the plane of the wafer. For the y direction the value of the sabre angle is given by a subtraction of the angle in x direction from 90°. However, the sabre angle generally may be determined based on a desired resolution and the physical implementation of the printing head like an arrangement of printing nozzles on the printing head. A printing speed may, for example, be between 1 and 8 kHz, for example, about 5 kHz, resulting in a printing speed of 150 mm/s.

Generally, print images, also referred to as print files, which extend beyond the edge of the wafer may be used in some embodiments to not only print upon the front side or back side of the wafer, but also on the edge.

A drop volume between 4 and 100 pl (picoliters), for example, about 80 pl may be used. When printing, a temperature of a wafer holder like a chuck may be between 20 and 40° C., for example, about 30° C. The temperature of the ink, for example imide, in a print head used may be between 50-40° C., for example, between 20 and 25° C. When printing in case of a movable printing device (like printing device 23 of FIG. 2) or a movable print head thereof, the print head (possibly together with the printing device) may be guided such that it prints both in x and in y direction and on each scanning track, i.e., on each path to be printed, arrives at least once from both directions to drop drops in movement direction against the vertical wafer edge. The print image used may be partitioned, for example, in four parts to obtain in some embodiments an approximately perpendicular angle of the scanning track to the wafer edge.

While above the use of a polyimide ink was discussed, other kinds of suitable inks, for example, epoxy inks, may also be used. In some embodiments, the ink used may be cross-linked by thermal activation at a temperature for example smaller than 380° C. In embodiments where after the printing process a formation of a metal layer is performed, characteristics of the ink are selected to be able to withstand processing conditions during the formation of the metal layer. For example, in case of electroless plating an ink is selected which may withstand extreme pH values at temperatures up to above 90° C. for several hours.

For example, in an embodiment a print head, for example of printing device 23 of FIG. 2, may be guided such that on each printing track the movement is at least once such that the printing head approaches a wafer edge from outside the wafer, for example, once from outside the wafer and once from inside the wafer. Therefore, ink drops at least once hit the edge, for example, curved edge, of the wafer in a frontal or steep manner. Furthermore, in an embodiment the printing head in some parts of the wafers is guided from or along the x direction and in another part in the y direction. For example, when the positive x direction corresponds to 0° and the negative x direction corresponds to 180° while the negative y direction corresponds to 90° and the positive y direction to 270°, in a first segment between 315° and 45° and in a second segment between 135° and 225° the print head may be guided along the x direction and in the remaining two segments (third segment from 225° to 315° and fourth segment from 45° to 135°) the print head may be guided along the y direction. Such a guiding may increase a wetting of the wafer edge in some embodiments and will now be explained with reference to FIGS. 14A and 14B. However, other guidings or ways of the print head are equally possible.

Figure 14A:
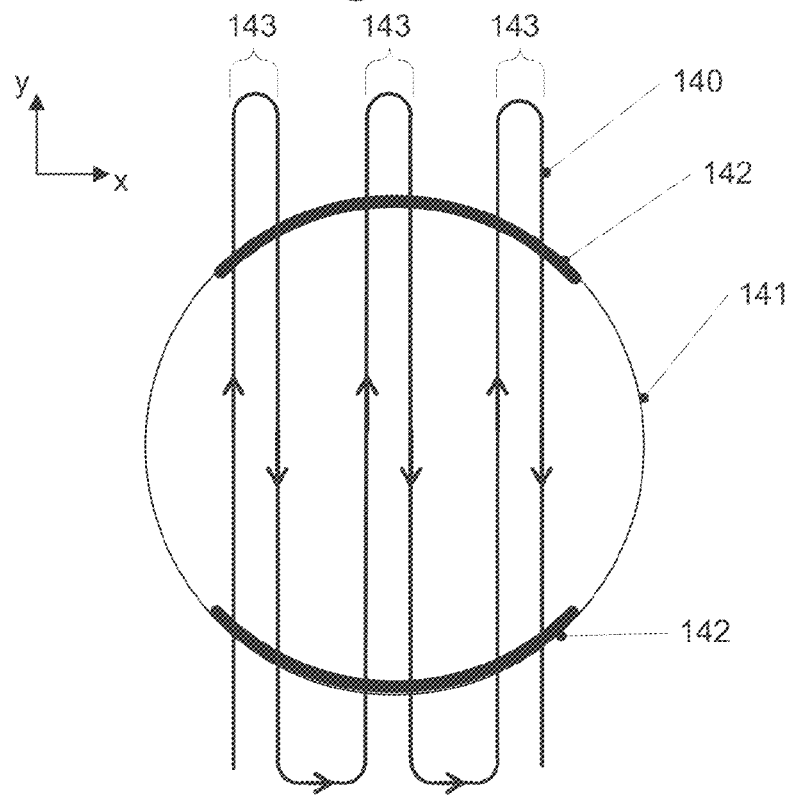
FIGS. 14A and 14B show schematic examples for printing paths according to an embodiment.
Figure 14B:
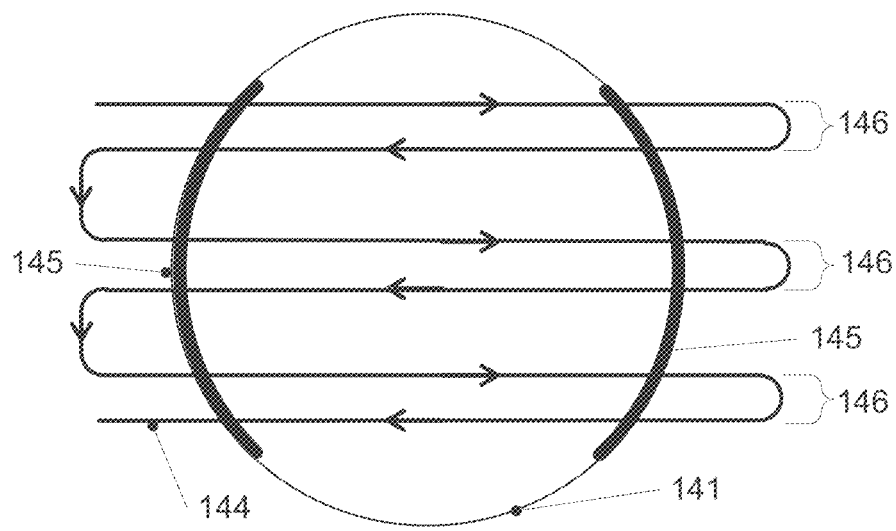

In FIG. 14A, the guiding of the print head in y direction, e.g., for the third and fourth segments of a wafer as mentioned above is shown. In FIG. 14B, the corresponding guiding along the x direction, e.g., for the first and second segments mentioned above is shown. In FIGS. 14A and 14B, 141 designates a wafer or other substrate which is schematically shown in top view. In FIG. 14A, the third and fourth segments are commonly denoted 142 and represented by a thicker line.

In FIG. 14B, the first and second segments are commonly denoted 145 and likewise represented by a thicker line.

In FIG. 14A, a path 140 is shown which schematically represents a movement of a print head relative to substrate 141. As an example, three print tracks 143 are shown besides each other. While the movement in positive y direction and negative y direction for each track 143 are shown offset from each other along the x direction, this is merely for illustration purposes to represent the movement in the two directions (positive and negative y), and actually the same path or approximately the same path may be used for moving in the positive y direction and the negative y direction. Furthermore, while three tracks 143 are shown in the example, this merely serves as a representation of any desired numbers of tracks. The number of tracks actually used may, for example, depend on a size of the print head and a size of substrate 141.

Likewise, in FIG. 14B a path 144 shows the way the print head moves relative to substrate 141 for printing in the peripheral region of substrate 141 in segments 145. Again, three tracks 146 are shown which are a representation of any desired number of tracks, similar to what was explained for tracks 143 of FIG. 14A.

In case of FIG. 14B, within each track the path in positive x direction has been represented offset from the path in negative x direction, although this is merely for ease of representation and also the same path or approximately the same path may be used.

When printing as represented in FIGS. 14A and 14B, printing is only activated in the peripheral region of substrate 141 and deactivated while the print head crosses a central region of substrate 141. It should be noted that while in FIG. 14A the path shown 140 serves to cover both segments 142 and in FIG. 14B path 144 serves to print both segments 145, in other embodiments also separate paths may be used for the two segments 142 and/or the two segments 145.

With the printing as represented in FIGS. 14A and 14B, for each track 143, 146 the print head passes the peripheral region of substrate 141 once from the outside and once from the inside of substrate 141, which in some embodiments serve to obtain a good wetting with ink also of the edge of substrate 141.

As mentioned above, paths 140 and 144 represent a relative movement of the print head to substrate 141. Such a relative movement generally may be obtained by moving the print head, by moving substrate 141 or a combination of the two. This will be illustrated below with reference to FIGS. 15 and 16.

Figure 15:
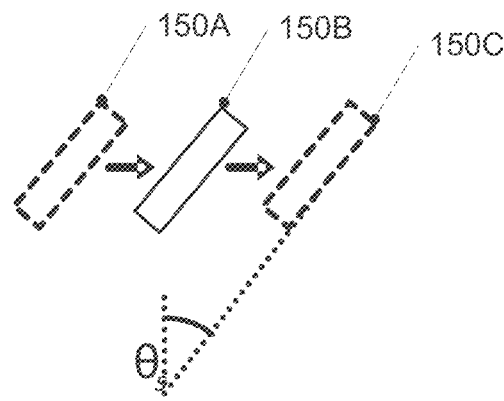
FIG. 15 shows a schematic view representing various positions of a print head according to an embodiment.

In FIG. 15, in order to illustrate a relative movement of the print head, a print head 150 is shown in three positions labeled 150A, 150B and 150C. $\theta_S$ represents the sabre angle, which may be varied to adjust a desired resolution. The three positions shown may, for example, be positions for the three tracks 143 in FIG. 14A, and then print head 150 moves in y direction (positive and negative) along the tracks.

Figure 16:
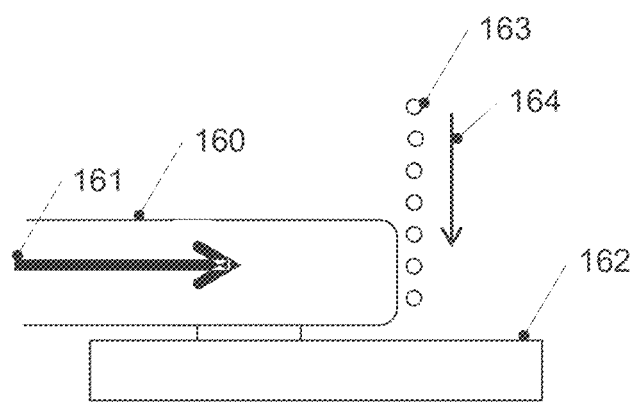
FIG. 16 shows a schematic representation of a movement of a substrate according to an embodiment.

In FIG. 16, a situation is shown where for obtaining the relative movement substrate 160 is moved by using a suitable substrate holder 162 as indicated by an arrow 161 while a print head ejecting ink drops 163 which fall due to gravity as indicated by an arrow 164 remains stationary. Of substrate 160, only a part including a peripheral region is shown. As can be seen through the movement, an edge of substrate 160 is hit by drops 163, therefore causing a printing on the edge of substrate 160 as well. This is an example embodiment to be used for the printing of FIG. 14B.

As already emphasized, movements of the print head and movements of the substrate may be combined in any desired manner depending on devices used to obtain the desired printing result.

Returning to FIG. 8, at 82 the ink printed at 81 is dried. For example, the drying may occur in a furnace or on a hot plate or through lamp heating to enable handling of the wafer without damaging the print. Drying temperatures are, for example, between 16° C. and 170° C., for example, at about 95° C. Drying times may, for example, be between 10 min and 20 min, for example, about 15 min.

At 83, the wafer is flipped or turned using for example wafer handler 22 of FIG. 2. After the flipping, the other side of front side and back side of the wafer is facing printing device 23. For example, if as in the example given above at 81 a back side of the wafer is printed on, after the flipping the front side of the wafer faces a print head of a corresponding printing device like printing device 23 of FIG. 2. After the flipping, now the already printed and dried side of the wafer for example lies on chuck ring 31 of FIGS. 3-7 and is held fast by applying a vacuum.

Figure 9B:
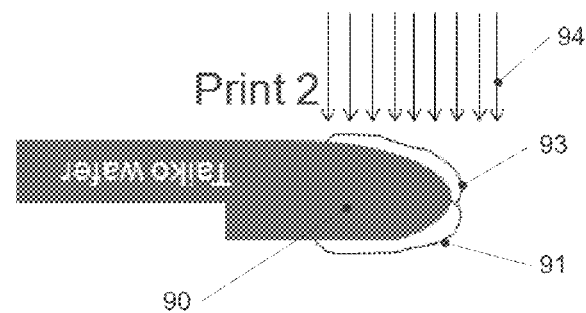

At 84, a second inkjet printing is performed on the opposite side of the wafer than the inkjet printing performed at 81. A simple example is shown in FIG. 9B. Here, wafer 90 of FIG. 9A has been flipped, and as indicated by arrows 94 a second print is performed, resulting in a second inkjet layer 93. In the example shown, the second print is performed such that second inkjet layer 93 touches or overlaps first inkjet layer 91 such that the complete edge, i.e., the complete side surface of wafer 90, as well as peripheral regions of the front side and back side are covered by inkjet layers 91 and 93. It should be noted that in some embodiment the overlap may be only partial, for example, with small areas not covered by first or second inkjet layers 91, 93. In some embodiments, even such a partial or incomplete overlap may prevent or at least reduce formation of flitter in a following metallization process.

The second printing in some embodiments may be performed with the same or with similar parameters as the first printing. For example, parameters in the ranges described for the first inkjet print at 81 may be used. In some embodiments, a printed area may be different from the area printed at 81, for example, smaller, to take into account devices or other structures formed on the front side of the wafer. For example, in an embodiment a ring-shaped print image or print file may be used with an inner diameter of 198.0 mm and an outer diameter of 201.0 mm for a 200 mm (8 inch) wafer. However, other print files may also be used.

Following the second inkjet print at 84, a second drying is performed at 85. In some embodiments, parameters used for the second drying at 85 may be the same as for the first drying at 82 or may be within the same parameter ranges as explained for the first drying at 82.

At 86, a curing is performed. For example, a wafer printed upon on both sides in a peripheral region and dried as explained above may be cured. The curing in some embodiments is performed at a temperature and with a time duration enabling a crosslinking of the ink used. In some embodiments, an inert gas like nitrogen ($N_2$) may be supplied during the curing. For curing, for example, a furnace, a hot plate or a lamp heater may be used. In some embodiments, the same device also used for the drying may be used. In a particular embodiment, curing may be performed at temperatures for example between 250° and 260° C., although depending on the ink used other temperatures may be applied as well. The time duration in a particular embodiment may be about one hour. In case of a temperature range as described above of 250-260° C., a ramp-up of the temperature to reach the curing temperature starting from, for example, 30° C. may last approximately 30 min.

After the curing, in some embodiments the wafer may be optically inspected, either manually or automatically.

After the curing, optionally in some embodiments, a metal deposition may be performed at 87 in FIG. 8. For example, metal may be deposited by electroless plating (e-less plating), for example, electroless plating of NiP onto an aluminum layer.

After the metal deposition, further process steps may occur as indicated by an arrow in FIG. 8. For example, these further steps may comprise a dicing to separate individual chips from each other. During such a dicing, in some embodiments the peripheral region of the wafer, for example, including a Taiko ring and inkjet layers applied as described above, may be removed and discarded.

Figure 10:
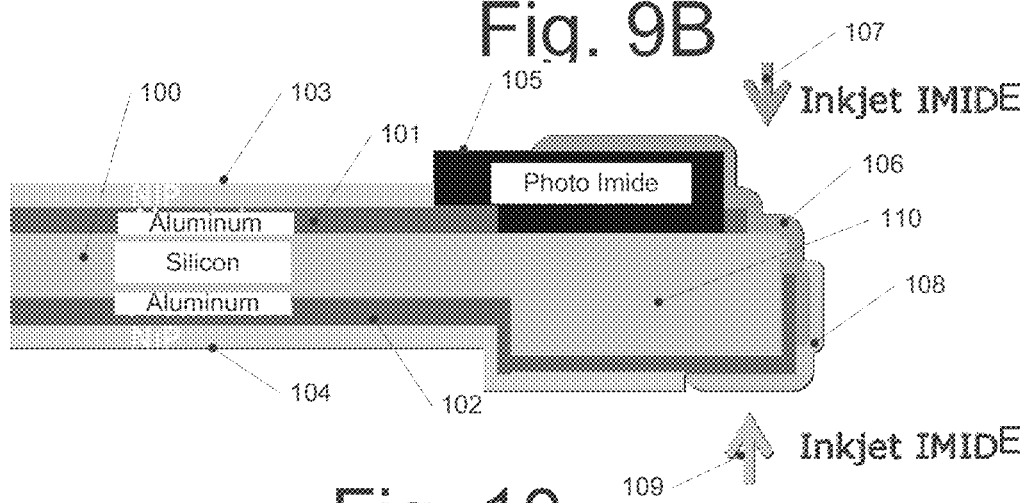
FIG. 10 is a schematic cross-sectional view of a device according to an embodiment.

Next, with reference to FIGS. 10-13 devices fabricated for example by apparatuses or methods as described above will be discussed. FIG. 10 shows a cross-sectional view of a part of a processed wafer according to an embodiment, the view showing a similar part of a substrate as the view of FIG. 1, i.e., a part of a substrate including a peripheral region.

The processed substrate of FIG. 10 comprises a silicon wafer 100 having a thicker peripheral region 110, for example, a Taiko ring. On a front side of the substrate, a photoimide layer 105 has been applied during previous processing stages, which in other embodiments may be omitted. Moreover, by an inkjet ring print a first inkjet layer 106 has been applied, and by a further inkjet print 109 a second inkjet layer 108 has been applied, which overlaps the first inkjet layer on a side face, i.e., an edge, of thicker portion 110. Furthermore, first inkjet layer 106 covers a front side of wafer 100 in a peripheral region thereof, and second inkjet layer 108 comprises a portion covering a back side of silicon wafer 100 in a peripheral region thereof.

An aluminum layer has been applied on a front side of wafer 100 followed by a NiP layer 103 applied, for example, by electroless plating, and on the back side of wafer 100 an aluminum layer 102 followed by a NiP layer 104 formed, for example, by electroless plating has been applied to the back side of wafer 100. While two metal layers have been formed on both front side and back side of the device of FIG. 10, in other embodiments more metal layers, fewer metal layers and/or metal layers of different metals or metal alloys may be formed. In some embodiments, first ink layer 106 and second ink layer 108 collectively may prevent the formation of flitter. In some embodiments, layers 106, 108 may be made of polyimide which is cross-linked, for example, due to a curing process. However, other suitable materials may be used as well.

Figure 11:
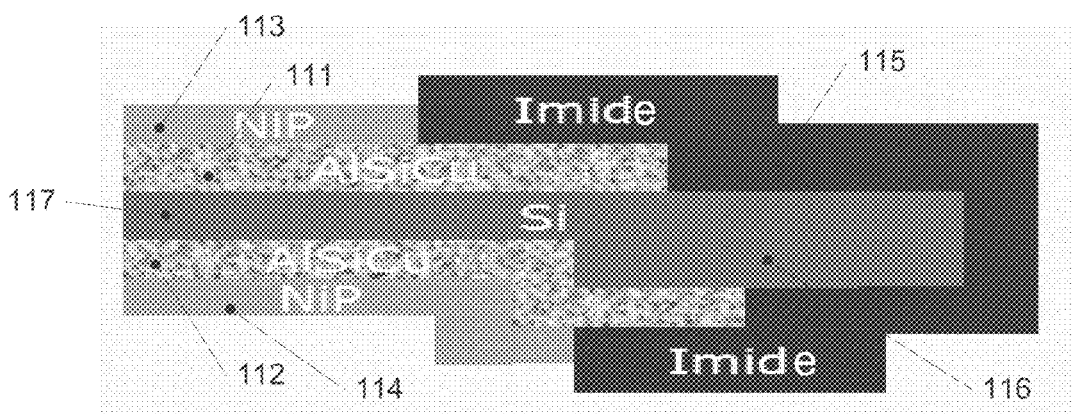
FIG. 11 is a schematic cross-sectional view of a device according to a further embodiment.

Next, with reference to FIG. 11 a further embodiment of a device which may, for example, be formed by using methods described above is shown. FIG. 11, in particular, shows a cross-sectional view of a part of a processed silicon wafer 117 including a peripheral region thereof. In the peripheral region of silicon wafer 117, a thick ring portion 116, for example, a Taiko ring, is present, while for example a central portion of silicon wafer 117 may have been thinned. In the embodiment of FIG. 10, aluminum layers 101, 102 may be deposited prior to inkjet printing for performing ink layers 106, 108.

On a front side of silicon wafer 117, a aluminum silicon copper (AlSiCu) layer 111 is formed, and on a back side of silicon wafer 107 an AlSiCu layer 112 is formed. Following the formation of layers 111, 112, an imide layer 115 is printed on a peripheral region of silicon wafer 117 covering a front side and a back side of silicon wafer 117 in a peripheral region and also covering a side surface or edge of silicon wafer 117. To form imide layer 115, two or more printing processes, for example, one printing process on a front side and another printing process on a back side, as described above, may be used in some embodiments. After the formation of imide layer 116 which may a cross-linked imide layer, nickel phosphorous (NiP) layers 113, 114 are formed on front side and back side of silicon wafer 117, respectively using, for example, electroless plating. In some embodiments, imide layer 115 prevents the formation of nickel flitters.

Figure 12:
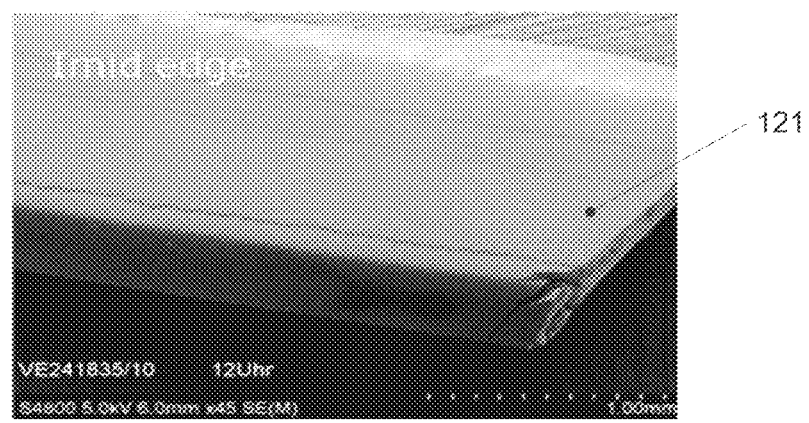
FIG. 12 is a microscopic image of a device according to an embodiment.
Figure 13:
FIG. 13 is a further microscopic image of a device according to an embodiment.

In FIGS. 12 and 13, electron microscopy images of devices formed, for example, with methods and apparatuses as described above are shown. For example, FIG. 12 shows a silicon wafer with an imide layer 121 as a covering layer formed in a peripheral region of the wafer. FIG. 13 shows a peripheral region of a silicon wafer 132 with an imide layer 131 formed on front side, back side and edge of silicon wafer 132 in the peripheral region.

It is to be emphasized that the above-described embodiments serve only as examples and are not to be construed as limiting. In particular, while specific features, dimensions, materials etc. have been given, these serve only as illustrative examples and may be replaced by other features, dimensions or materials. Furthermore, while in some embodiments the complete peripheral region of a substrate may be printed on, in other embodiments only some parts of the peripheral region of the substrate may be printed on. While in some embodiments both sides of a substrate are printed on, in some embodiments it may be sufficient to print only on one side of the substrate. Also, while in some cases two layers have been shown as overlapping on an edge of the substrate, in other embodiments no overlap or an incomplete overlap leaving some gaps may be present.

What is claimed is:

1. A method comprising:
   inkjet printing a first covering layer on a first side of a substrate in a peripheral region of the substrate, wherein inkjet printing the first covering layer comprises printing the first covering layer on at least part of an edge of the substrate; and
   inkjet printing a second covering layer on a second side of the substrate opposite the first side in the peripheral region of the substrate.

2. The method of claim 1, wherein one of the first covering layer and the second covering layer overlaps the other one of the first covering layer and the second covering layer on the edge.

3. The method of claim 1, further comprising flipping the substrate between inkjet printing of the first covering layer and inkjet printing of the second covering layer.

4. The method of claim 3, further comprising drying the first covering layer prior to flipping.

5. The method of claim 1, further comprising curing the first covering layer.

6. The method of claim 1, wherein the first covering layer comprises at least one of a polyimide or an epoxy ink.

7. The method of claim 1, wherein inkjet printing for each part of the peripheral region to be printed is performed once coming from an outside of the substrate and once coming from an inside of the substrate.

8. The method of claim 1, wherein a printing direction of the inkjet printing in a first segment of the substrate differs from a printing direction in a second segment of the substrate different from the first segment.

9. An apparatus comprising:
   a substrate holder; and an inkjet printing device configured to print a covering layer on a peripheral region of a substrate on the substrate holder, wherein the substrate holder is configured to support the substrate only at the peripheral region of the substrate.

10. The apparatus of claim 9, further comprising a wafer handler configured to flip the substrate on the substrate holder after a first covering layer has been printed on the peripheral region of the substrate by the printing device, wherein the printing device is configured to print a second covering layer on the peripheral region of the substrate after the substrate has been flipped by the wafer handler.

11. The apparatus of claim 9, further comprising a drying device configured to dry an ink layer.

12. The apparatus of claim 9, wherein the substrate holder comprises a drip ring.

13. A device comprising:
a substrate;
a first inkjet printed layer on a first side of the substrate and at least part of an edge of the substrate in a peripheral region of the substrate; and
a second inkjet printed layer on a second side of the substrate opposite the first side and at least part of the edge in the peripheral region of the substrate.

14. The device of claim 13, wherein the first inkjet printed layer at least partially overlaps the second inkjet printed layer.

15. The device of claim 13, wherein at least one of the first inkjet printed layer and the second inkjet printed layer comprises at least one of a polyimide or an epoxy ink.

16. The device of claim 13, wherein at least one of the first inkjet printed layer and the second inkjet printed layer is cross-linked.

17. A method comprising:
inkjet printing a first covering layer on a first side of a substrate in a peripheral region of the substrate, wherein inkjet printing for each part of the peripheral region to be printed is performed once coming from an outside of the substrate and once coming from an inside of the substrate.

18. A method comprising:
inkjet printing a first covering layer on a first side of a substrate in a peripheral region of the substrate, wherein a printing direction of the inkjet printing in a first segment of the substrate differs from a printing direction in a second segment of the substrate different from the first segment.

19. An apparatus comprising:
a substrate holder;
an inkjet printing device configured to print a covering layer on a peripheral region of a substrate on the substrate holder; and
a wafer handler configured to flip the substrate on the substrate holder after a first covering layer has been printed on the peripheral region of the substrate by the printing device, wherein the printing device is configured to print a second covering layer on the peripheral region of the substrate after the substrate has been flipped by the wafer handler.

20. An apparatus comprising:
a substrate holder;
an inkjet printing device configured to print a covering layer on a peripheral region of a substrate on the substrate holder; and
a drying device configured to dry an ink layer.

21. An apparatus comprising:
a substrate holder; and
an inkjet printing device configured to print a covering layer on a peripheral region of a substrate on the substrate holder, wherein the substrate holder comprises a drip ring.

\* \* \* \* \*